United States Patent
Becker et al.

(10) Patent No.: US 9,444,162 B1
(45) Date of Patent: *Sep. 13, 2016

(54) DIMM CONNECTOR REGION VIAS AND ROUTING

(71) Applicant: International Business Machines Corporation, Armonk, NY (US)

(72) Inventors: Wiren D. Becker, Hyde Park, NY (US); William L. Brodsky, Binghamton, NY (US); Matteo Cocchini, Long Island City, NY (US); Michael A. Cracraft, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/086,716

(22) Filed: Mar. 31, 2016

Related U.S. Application Data

(63) Continuation of application No. 14/833,729, filed on Aug. 24, 2015.

(51) Int. Cl.
| | |
|---|---|
| *H01R 12/51* | (2011.01) |
| *H01R 43/28* | (2006.01) |
| *H01R 12/73* | (2011.01) |
| *H05K 1/11* | (2006.01) |

(52) U.S. Cl.
CPC .......... *H01R 12/737* (2013.01); *H05K 1/112* (2013.01); *H05K 2201/094* (2013.01)

(58) Field of Classification Search
CPC .. H01R 12/51; H01R 43/28; H01R 23/7068; H01R 23/725; H01R 9/096; H01R 23/722; H01R 12/52; H05K 1/117; H05K 1/111; H05K 1/182; H01L 2924/01079; H01L 2924/01078; H02G 1/1256
See application file for complete search history.

(56) References Cited

U.S. PATENT DOCUMENTS

| | | | |
|---|---|---|---|
| 8,040,683 B2 | 10/2011 | Karabatsos | |
| 8,611,097 B2* | 12/2013 | Yin | G06F 1/189 361/679.31 |
| 8,625,269 B2* | 1/2014 | Chen | G06F 1/185 361/679.31 |
| 8,625,303 B2* | 1/2014 | Yin | G06F 1/185 361/679.31 |
| 2005/0170673 A1 | 8/2005 | Choi | |
| 2013/0038999 A1* | 2/2013 | Tian | G06F 3/0658 361/679.41 |

(Continued)

OTHER PUBLICATIONS

List of IBM Patents or Patent Applications Treated as Related; (Appendix P), Filed Aug. 24, 2015; 2 pages.

(Continued)

*Primary Examiner* — Gary Paumen
(74) *Attorney, Agent, or Firm* — Cantor Colburn LLP; Margaret McNamara

(57) ABSTRACT

A dual in-line memory module (DIMM) connector system is provided. The DIMM connector system includes a motherboard, a DIMM card and a connector by which the DIMM card is coupled with the motherboard. The motherboard includes a printed circuit board (PCB) formed of a mid-loss dielectric constant material, signal pads that are thinner than ground pads, ground pads disposed proximate to signal pads, signal vias connected to distal edges of signal pads and shared antipads. The DIMM card includes a printed circuit board (PCB) formed of a mid-loss dielectric constant material, signal pads that are thinner than ground pads, signal vias connected to distal edges of signal pads and shared antipads for respective pairs of signal vias.

1 Claim, 16 Drawing Sheets

(56) References Cited

U.S. PATENT DOCUMENTS

| | | | |
|---|---|---|---|
| 2013/0070412 A1* | 3/2013 | Ge | G06F 1/185 361/679.32 |
| 2013/0094167 A1* | 4/2013 | Chen | G06F 1/185 361/791 |
| 2013/0155637 A1* | 6/2013 | Yin | G06F 1/185 361/791 |
| 2014/0160664 A1* | 6/2014 | Yang | G06F 1/185 361/679.32 |
| 2014/0268614 A1 | 9/2014 | Zhang et al. | |
| 2015/0062797 A1* | 3/2015 | Yin | G06F 1/185 361/679.32 |
| 2015/0340817 A1* | 11/2015 | Li | H01R 13/6598 439/62 |

OTHER PUBLICATIONS

Wiren D. Becker et al., "DIMM Connector Region Vias and Routing", U.S Appl. No 14/833,729, filed Aug. 24, 2015.

* cited by examiner

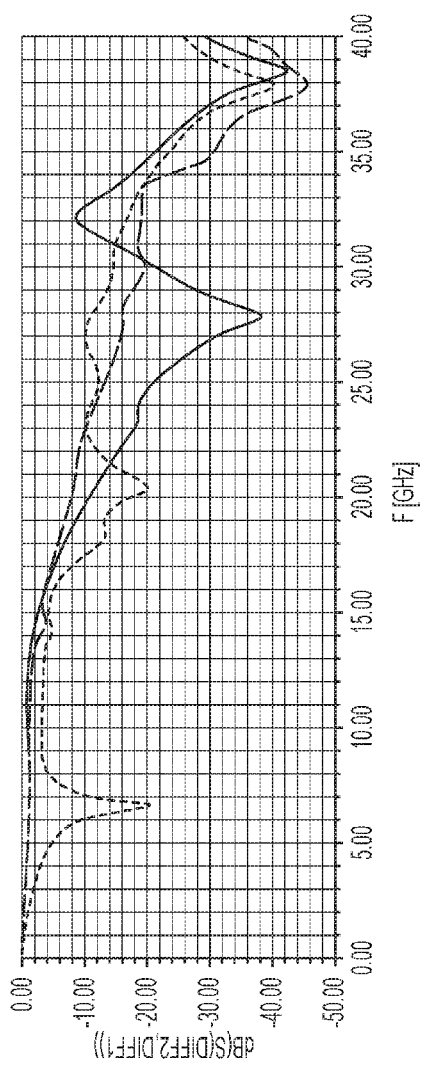
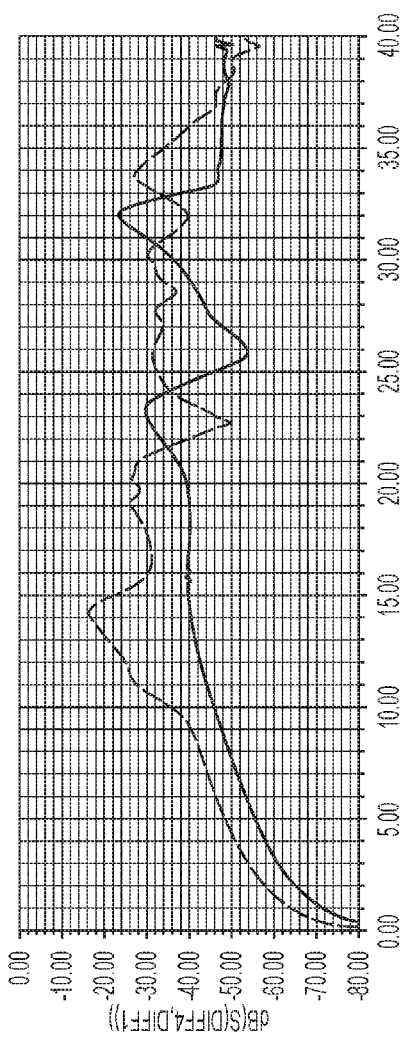

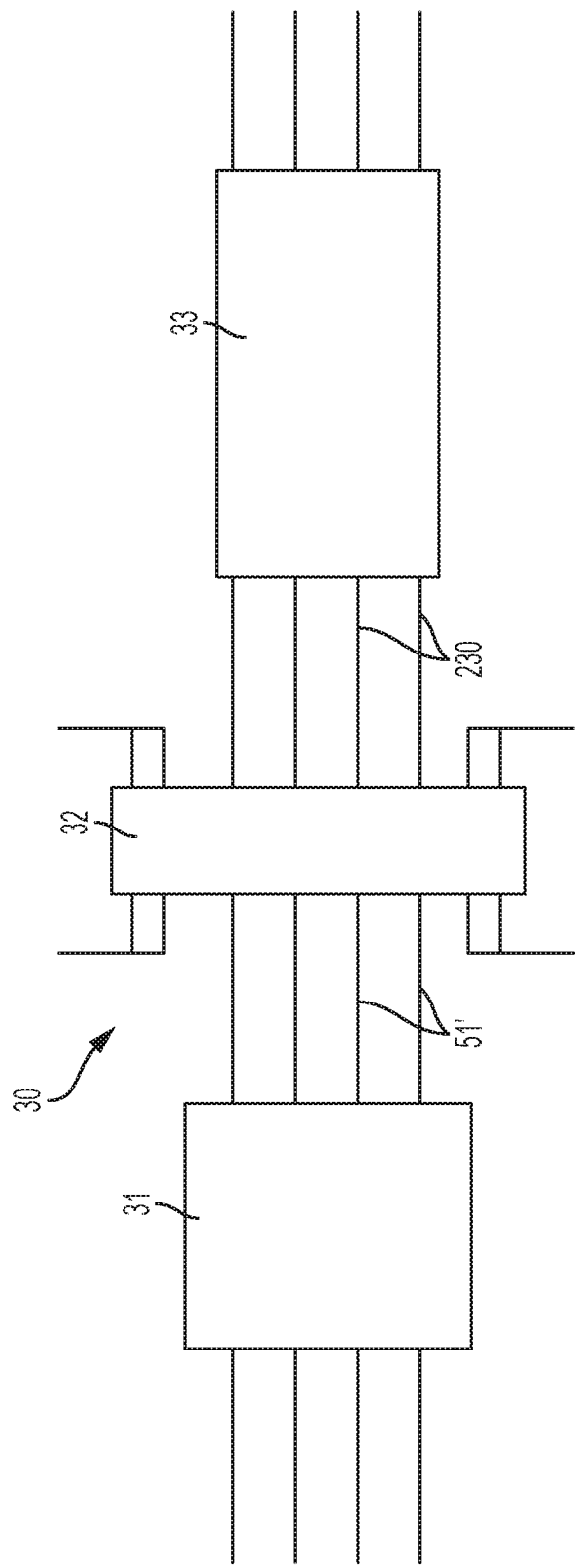

US 9,444,162 B1

DIMM CONNECTOR REGION VIAS AND ROUTING

CROSS-REFERENCE TO RELATED APPLICATION

This application is a continuation of and claims the benefit of priority to U.S. application Ser. No. 14/833,729, which was filed on Aug. 24, 2015. The entire contents of U.S. application Ser. No. 14/833,729 are incorporated herein by reference.

BACKGROUND

The present invention relates to DIMM connectors and, more specifically, to DIMM connectors with DIMM connector region vias and routing for, e.g., 16 Gb/s signals.

A dual in-line memory module (DIMM) generally includes a series of dynamic random-access memory (DRAM) integrated circuits (ICs) and is often mounted on a printed circuit board (PCB) for use in personal computers, workstations and servers. DIMMs were developed as replacements for single in-line memory modules (SIMMs), which became unwieldy as processing capabilities increased over the years. Indeed, while some contacts on single in-line memory modules (SIMMs) are redundant and have 32-bit data paths, DIMMs have separate electrical contacts on each module side and a 64-bit data path. Thus, where a processor has a 64-bit bus width, SIMMs would need to be installed in matched pairs in order to populate the data bus, with the processor then accessing the two SIMMs in parallel. DIMMs were introduced to eliminate this practice.

While there are now many different DIMM variations available, many DIMMs are built using "×4" ("by four") or "×8" ("by eight") memory chips with nine chips per side. Here, "×4" and "×8" refer to the data width of the DRAM chips in bits. In the case of "×4" registered DIMMs, the data width per side is 36 bits and, therefore, the memory controller (which requires 72 bits) needs to address both sides at the same time to read or write the data it needs. In this case, the two-sided module is single-ranked. For "×8" registered DIMMs, each side is 72 bits wide, so the memory controller only addresses one side at a time (the two-sided module is dual-ranked).

In any form, DIMMs are arguably the most popular option for memory used in modern computing devices and systems but can exhibit crosstalk among pins. Thus, as data-rate demands for fully-buffered DIMM applications are soon to exceed 3 Gb/s, improvements to DIMM performance characteristics may be required.

SUMMARY

According to one embodiment of the present invention, a dual in-line memory module (DIMM) connector system is provided and includes a motherboard comprising a printed circuit board (PCB) formed of mid-loss dielectric constant material FR4061, signal pads that are thinner than ground pads with the ground pads being disposed adjacent to the signal pads, signal vias connected to distal edges of the signal pads and shared antipads, a DIMM card comprising a printed circuit board (PCB) formed of mid-loss dielectric constant material FR4061, signal pads that are thinner than ground pads, signal vias connected to distal edges of the signal pads and shared antipads for respective pairs of the signal vias and a connector by which the DIMM card is coupled with the motherboard.

Widths of the signal pads are about 25% of the widths of the ground pads and the shared antipads are rectangular and distal ends of the signal pads include flat edges and a single convex curved edge interposed between and terminating at the flat edges.

The DIMM connector system further includes surface mounts (SMTs) extending from the signal vias with each having a respective single angular portion.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

FIG. 5 is a graphical depiction of insertion loss performance of the modified motherboard of FIG. 4;

FIG. 6 is a graphical depiction of crosstalk performance of the modified motherboard of FIG. 4;

FIG. 19 is a schematic diagram illustrating components of a connector system in accordance with embodiments.

DETAILED DESCRIPTION

Current technologies and strategies used to route signals out of a dual in-line memory module (DIMM) connector region could face significant issues with high speed signals, such as 16 Gb/s signals. Particularly, current card designs that have been proven to work for slower speed signals exhibit excess attenuation and crosstalk when used for high speed signals and thus impede the obtaining of a clear signal at a receiver. With this in mind, layouts and strategies to reduce losses, reflections and crosstalk in both DIMM card and supporting motherboard structures are proposed. In particular embodiments, in order to improve performances of a given DIMM connector system, a printed circuit board (PCB) supporting the DIMM connector and the DIMM card that will be plugged into the DIMM connector are modified. For the motherboard, the modifications can include backdrilling, placement of signal vias directly on pads, formation of shared antipads instead of single circular antipads, addition of GND vias and thinning of the pad width. For the DIMM card, the modifications can include thinning pads, shared antipads and 90 degree rotation of differential pairs to avoid serpentine escape routing and discontinuities.

Figure 1:
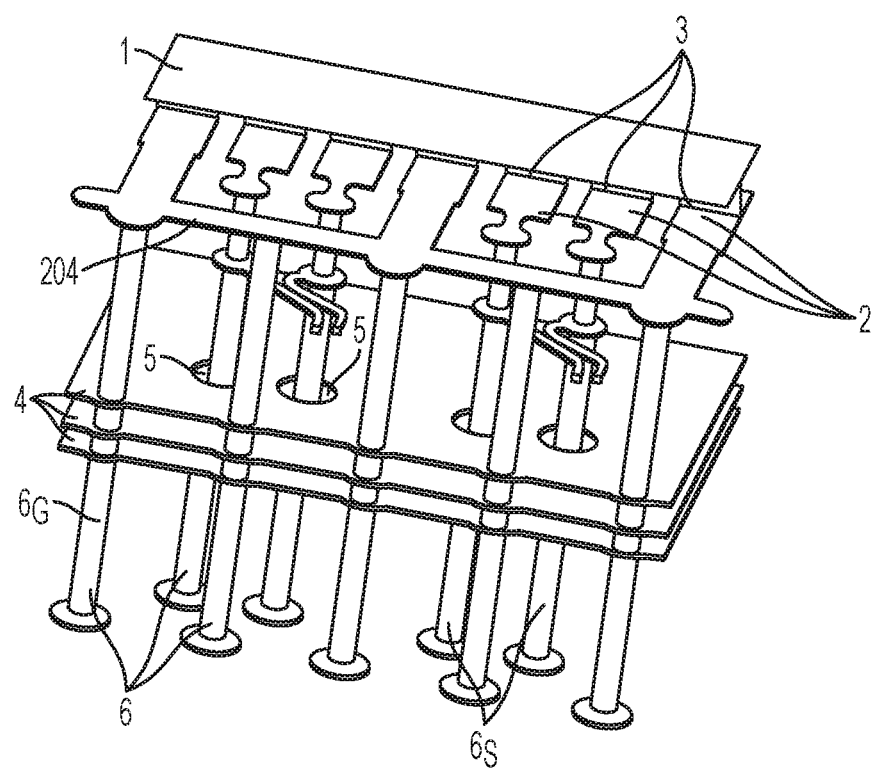
FIG. 1 is perspective view of an unmodified motherboard of a dual in-line memory module (DIMM) connector system.

With reference to FIG. 1, an unmodified motherboard includes connector reference plane 1, a plurality of pads 2 and a corresponding plurality of simulated PCB-pad transitions 3 by which the pads 2 may be electrically coupled to the connector reference plane 1. The connector reference plane 1 may be provided as an elongate member having a major width axis and a minor length axis that define a plane. The simulated PCB-pad transitions 3 are modeled to extend away from a surface of the connector reference plane 1. Each of the pads 2 may be provided as an elongate element that has a major length axis and a minor width axis that respectively define a pad plane. The pads 2 may be coplanar with one another such that each of the pads 2 extends along the same pad plane.

Whether the pads 2 are coplanar or not, the pads 2 are arranged at a different plane from the plane of the connector reference plane 11 and respectively include first portions, which are electrically coupled to the connector reference plane 1 and are covered by the connector reference plane 1, and second portions that extend beyond an edge of the connector reference plane 1. The pads 2 may include outermost (or ground) pads 2 that are proximate to outer edges of the connector reference plane 1, a central (or ground) pad 2 that is proximate to a center of the connector reference plane 1 and intermediate (or signal) pads 2, which are interposed between the outer-most pads 2 and the central pad 2. Distal ends of the second portions of the outermost pads 2 and the central pad 2 may be connected by a pad connector 204 whereas distal ends of the intermediate pads 2 may terminate short of a proximal edge of the pad connector 204. The outermost and central pads 2 may be provided for ground signal and power transmission and the intermediate pads 2 may be provided for source signal transmission.

The motherboard shown in FIG. 1 further includes sub-laminate layers 4, antipads 5 and signal vias 6. The sub-laminate layers 4 are provided below the pads 2 and are formed to define the antipads 5 as circular holes. A portion of the signal vias 6 extend from the distal ends of each of the outermost and central pads 2 and through the sub-laminate layers 4 and will hereinafter be referred to as ground/power vias $6_G$. Another portion of the signal vias 6 extend from the distal ends of each of the intermediate pads 2 and through the antipads 5 and will hereinafter be referred to as signal vias $6_S$. The ground/power vias $6_G$ and the signal vias $6_S$ terminate at terminal pads disposed along a same plane.

Figure 2:
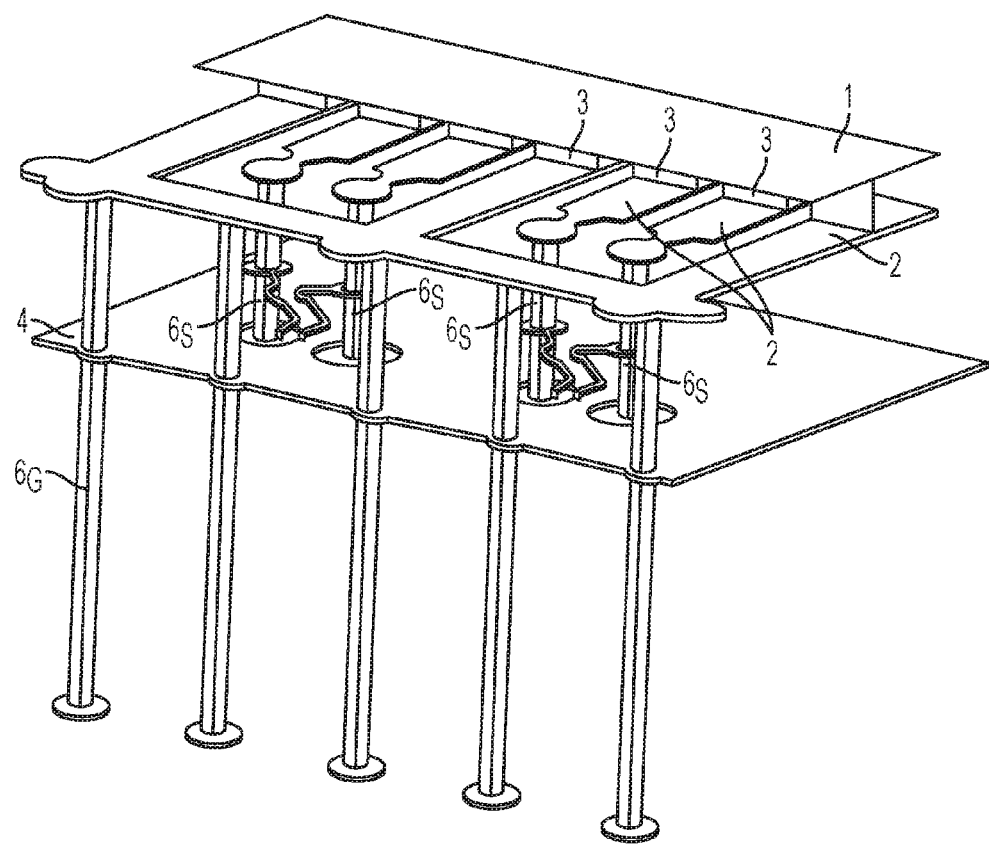
FIG. 2 is perspective view of a modified motherboard of a dual in-line memory module (DIMM) connector system in accordance with an embodiment.
Figure 3:
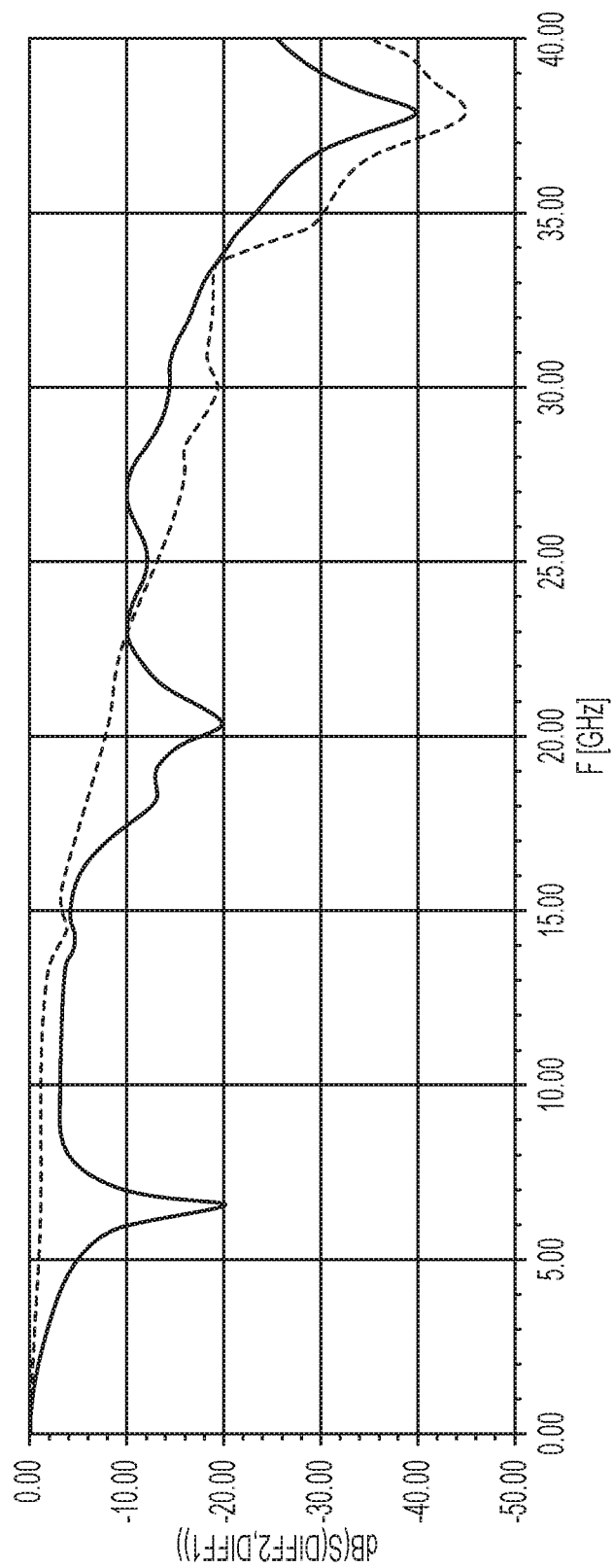
FIG. 3 is a graphical depiction of insertion loss performance of the modified motherboard of FIG. 2.

With continued reference to FIG. 1 and with additional reference to FIGS. 2 and 3, an initial modification may but does not need to involve a reduction or an increase in a number of the sub-laminate layers 4 and includes a backdrilling of the signal vias $6_S$. Such backdrilling will serve to reduce the respective lengths of the signal vias $6_S$ to about 15 mils, for example, and will thereby reduce an incidence of signal integrity issues associated with the signal vias $6_S$. As shown in FIG. 3, in which differential insertion loss of an unmodified motherboard and a backdrilling motherboard are illustrated by the solid and dashed lines, respectively, effects of backdrilling are noticeable with the deep resonance of the unmodified motherboard around 5 GHz disappearing and the resulting curve of the modified motherboard remaining above the −10 dB threshold below 20 GHz.

Hereinafter, in each graphical display, the dashed line relates to an unmodified case and the solid line relates to a modified case.

Figure 4:
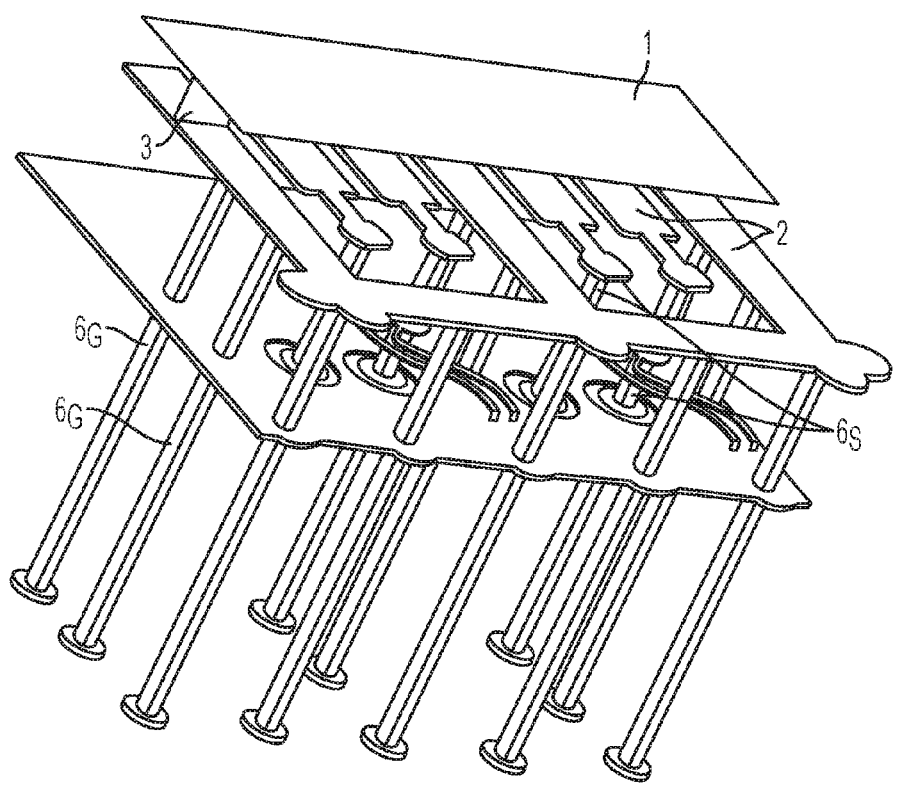
FIG. 4 is perspective view of a modified motherboard of a dual in-line memory module (DIMM) connector system.

With reference to FIGS. 4-6, a further modification in accordance with embodiments involves the addition of additional ground/power vias $6_{G2}$ on the outermost and central pads 2. That is, for each of the outermost and central pads 2, an additional ground/power via $6_{G2}$ will be provided proximate to the simulated PCB-pad transition 3 and another additional ground/power via $6_{G2}$ will be provided at a pad midpoint. Being proximal to the signal vias $6_S$, these additional ground/power vias $6_{G2}$ provide insertion loss benefits due to a reduction of loop inductances associated with the signal vias $6_S$, as shown in FIG. 5, and crosstalk shielding among pairs of vias, as shown in FIG. 6.

As to the insertion losses shown in FIG. 5, an improvement is quantifiable are about 1 dB in the region between 10 GHz and 15 GHz but a significant addition in losses exists in the region between 20 GHz and 30 GHz. The curve resonance at 27 GHz is due to a larger capacitance between the closer ground/power vias $6_{G2}$ and the differential pair and may be addressed by the modification relating to FIGS. 7 and 8.

Figure 7:
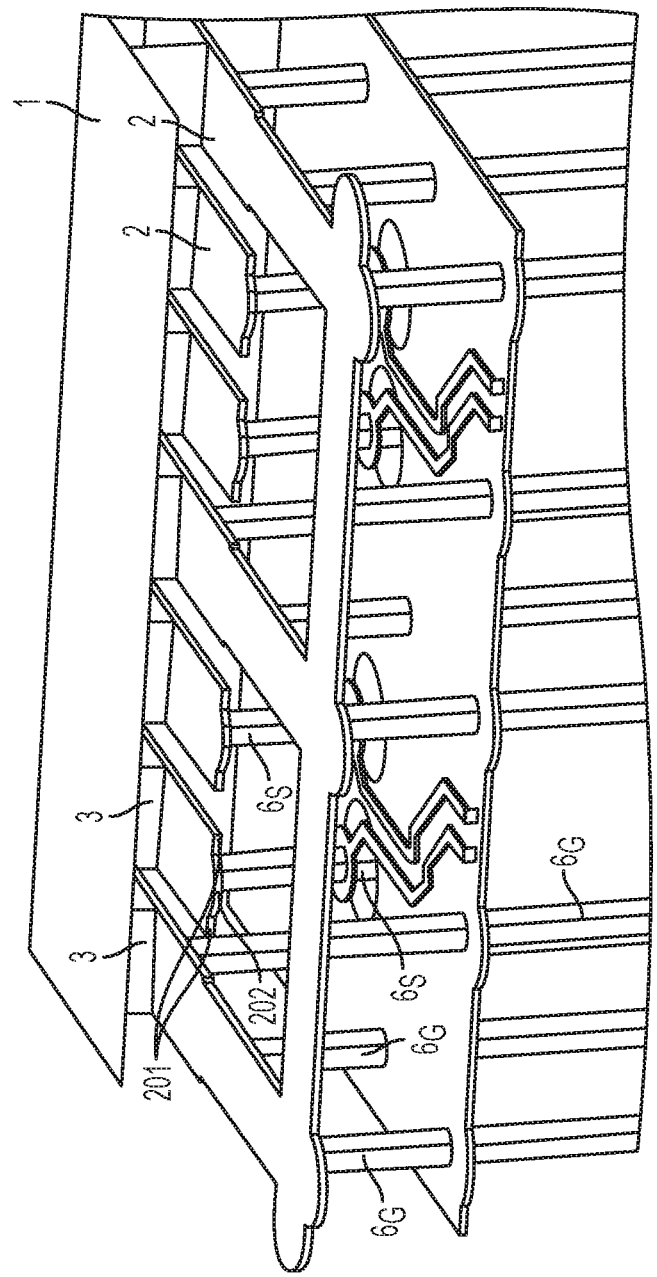
FIG. 7 is perspective view of a modified motherboard of a dual in-line memory module (DIMM) connector system.
Figure 8:
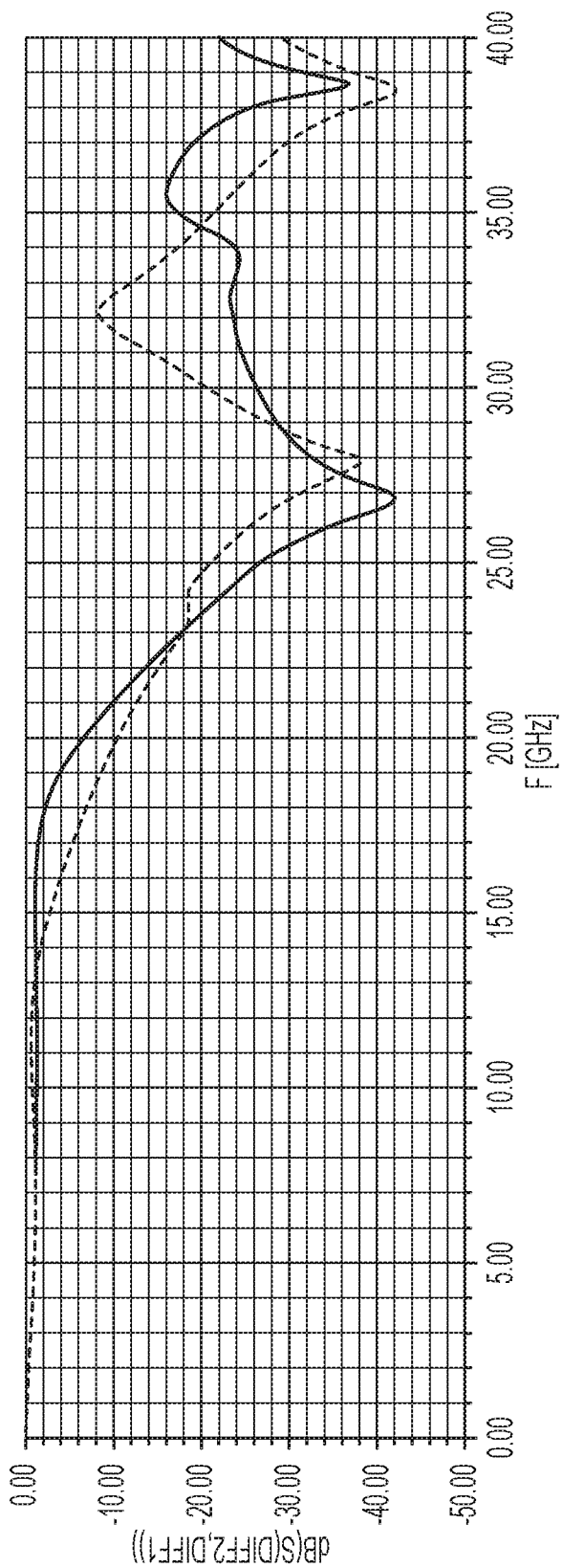
FIG. 8 is a graphical depiction of insertion loss performance of the modified motherboard of FIG. 7.

With reference to FIGS. 7 and 8, a next modification in accordance with embodiments involves the removal of tabs at the distal ends of each of the intermediate pads 2 and the subsequent movement of the signal vias $6_S$ directly onto the remainder of the intermediate pads 2 to effectively shorten the intermediate pads 2 and thereby reduce discontinuities between the intermediate pads 2 and the signal vias $6_S$. The shortening of the intermediate pads 2 also removes portions of traces, which are used to couple the simulated PCB-pad transitions 3 with the signal vias $6_S$ and which creates unwanted high order modes in the region that contribute to impedance mismatches. In accordance with embodiments, distal edges of the shortened intermediate pads 2 may include flat edges 201 and a curved, convex edge 202 terminating at the flat edges 201. As shown in FIG. 8, this modification has a relevant effect on insertion losses in the spectral region between 13 GHz and 23 GHz.

Figure 9:
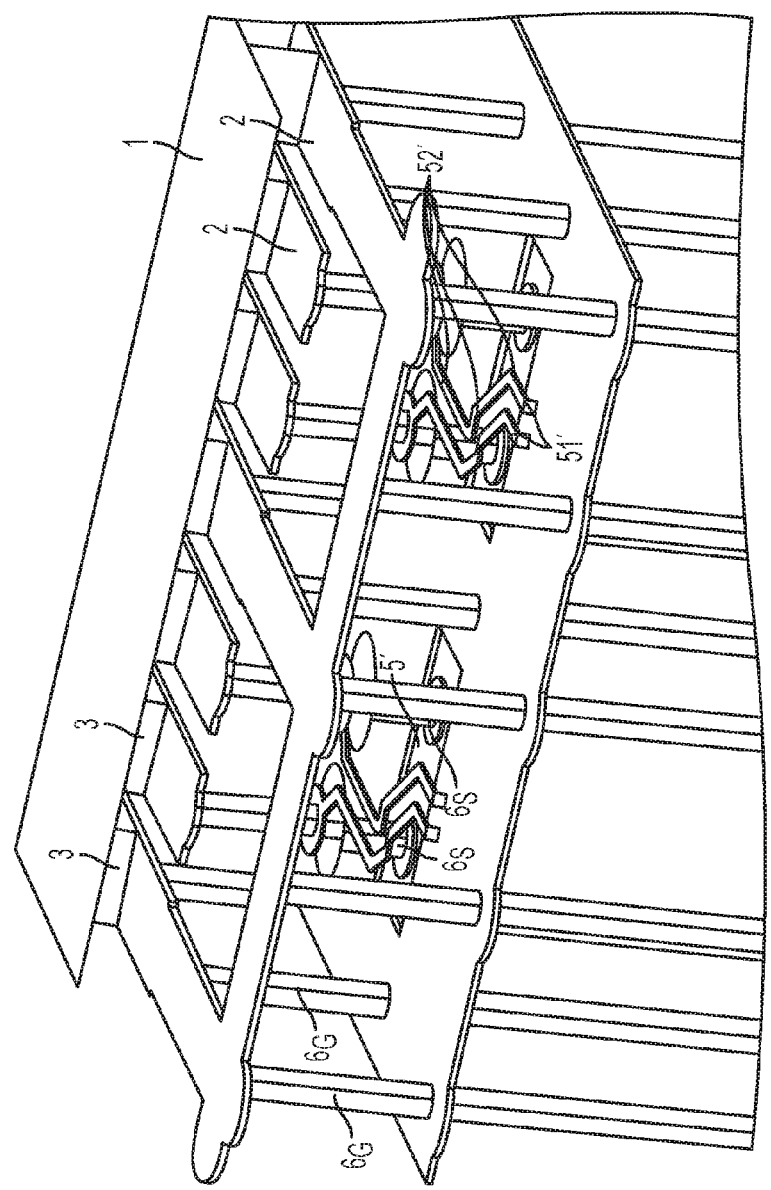
FIG. 9 is perspective view of a modified motherboard of a dual in-line memory module (DIMM) connector system.
Figure 10:
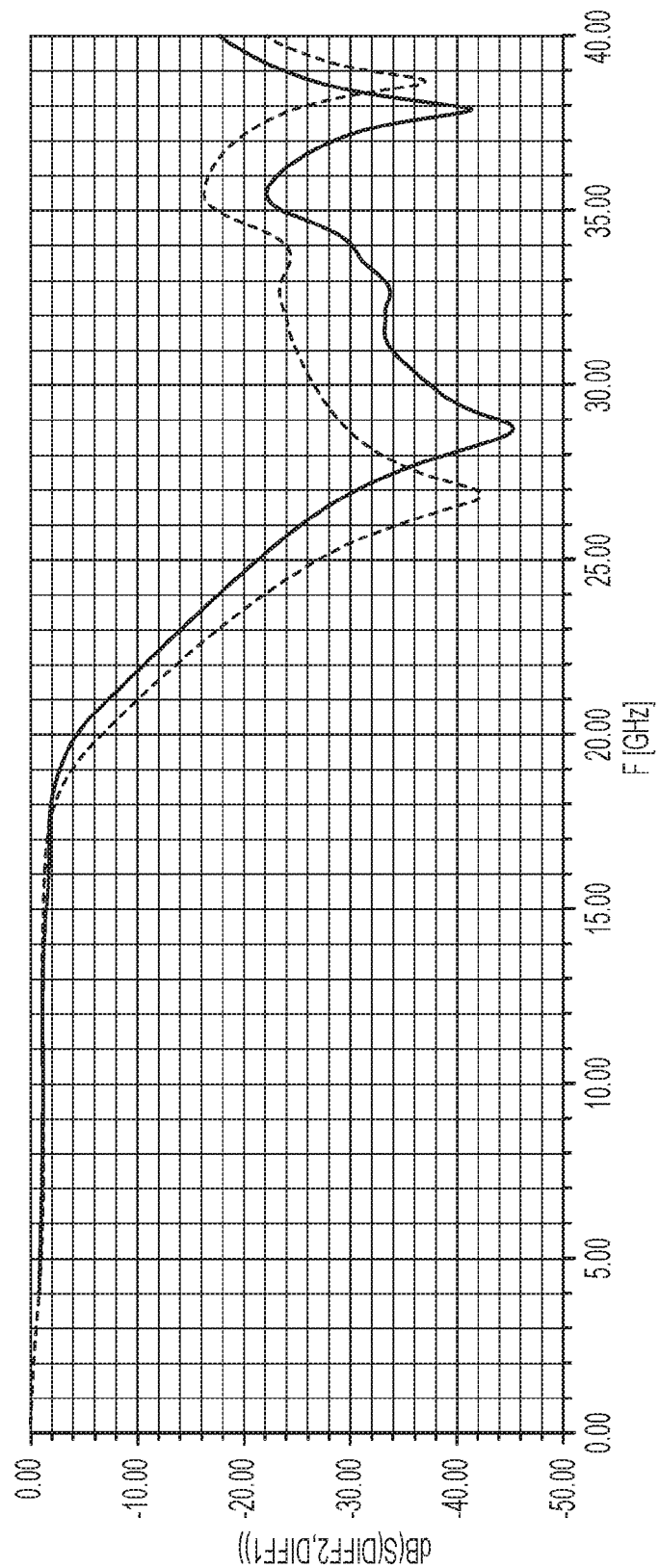
FIG. 10 is a graphical depiction of insertion loss performance of the modified motherboard of FIG. 9.
Figure 11:
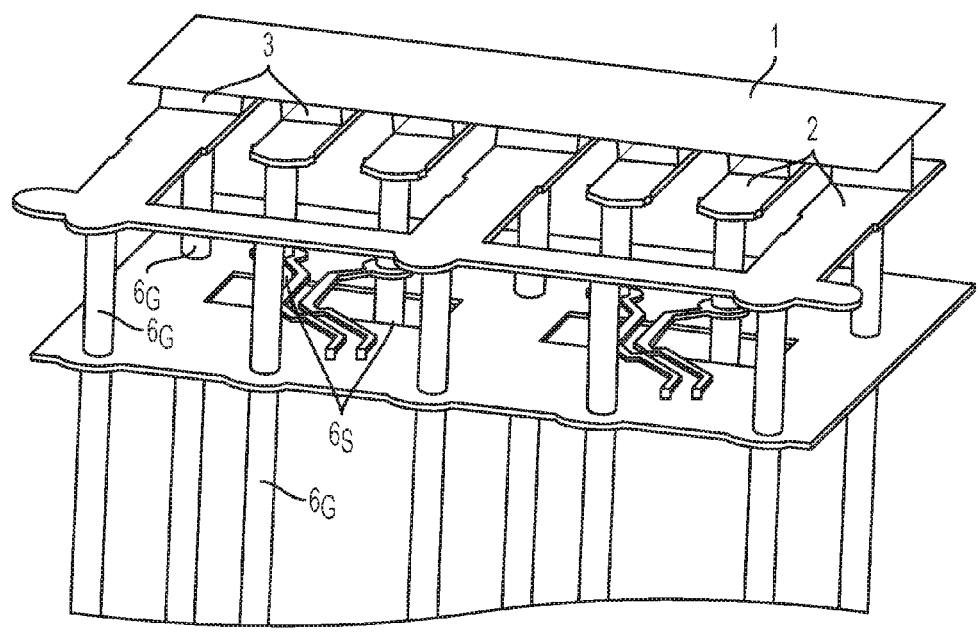
FIG. 11 is perspective view of a modified motherboard of a dual in-line memory module (DIMM) connector system.

With reference to FIGS. 9 and 10, the antipads 5 should be designed as a general matter to have a via-to-plane capacitance approximating as much as possible the characteristic impedances of the signal transmitted along the signal vias $6_S$. With this in mind, since structure of the signal via $6_S$ is not in and of itself a transmission line, the impedance observed at every instant during the signal via $6_S$ transition is not constant. Thus, using standard materials, a regular circular antipad-per-via configuration presents excessive capacitance in order to achieve a differential impedance in the order of about 85-100Ω. As such, the modification of FIGS. 9 and 10 involves the re-configuration of the antipads 5 into a single large antipad 5' on plated through-holes (PTH) with surface mountings (SMTs) 51'. This single large antipad 5' may, in some cases, be rectangular and encompasses the two proximal signal vias $6_S$ and reduces the associated capacitance. The SMTs 51' extend from the signal vias $6_S$ and may terminate near or proximate to a long edge of the sub-laminate layer 4 and may have up to three angular portions 52'.

As shown in FIG. 10, the formation of the single large antipad 5' leads to an improvement of about 2-5 dB between 18 GHZ and 27 GHz. Also, the deep resonance at about 27 GHz in the previous configurations is now shifted to higher frequencies (e.g., about 28.8 GHz) with the new geometry of the antipad 5'. This means that that resonance is strictly connected to the capacitance between the signal vias 6S and the ground/power vias $6_{G2}$.

Figure 12:
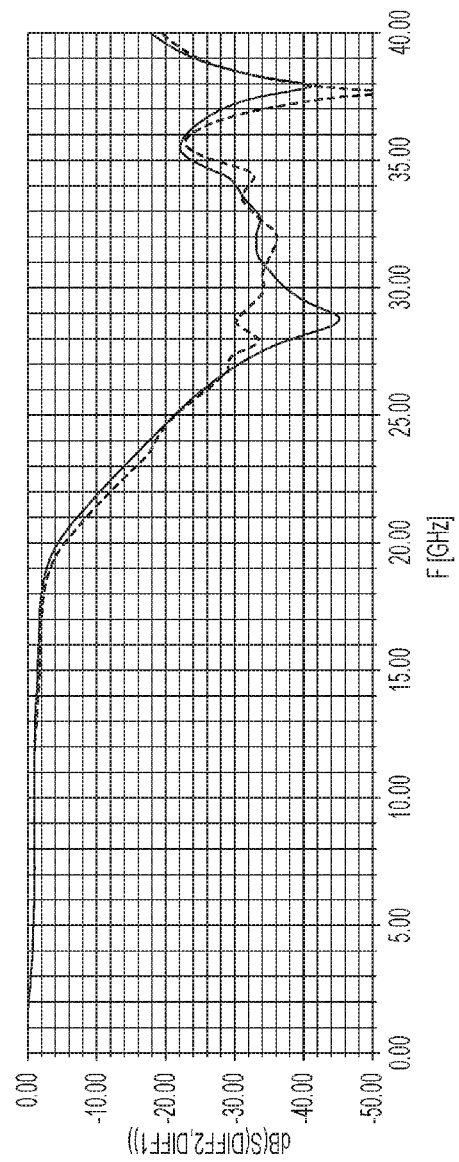
FIG. 12 is a graphical depiction of insertion loss performance of the modified motherboard of FIG. 11.

With reference to FIGS. 11-15, final modifications of the motherboard in accordance with embodiments involve the removal of the additional ground/power vias $6_{G2}$ at the midpoint of the outermost and central pads 2, the thinning of the intermediate pads 2 and a change in material selection. The removal of the additional ground/power vias $6_{G2}$ will reduce path capacitances at the cost of a somewhat larger loop for return current since the return current has to flow through the other ground/power vias $6_G$ and additional ground/power vias $6_{G2}$. This larger loop means larger parasitic inductances and hence larger reflections. That is, as shown in FIG. 12, the present modification provides for a reduction of the dip around 29 GHz that moves from about −45 dB to about −32 dB due to reduced capacitance but, between 18 GHz and 23 GHz, the effect of a larger loop inductance is a slightly worse insertion loss.

Figure 13:
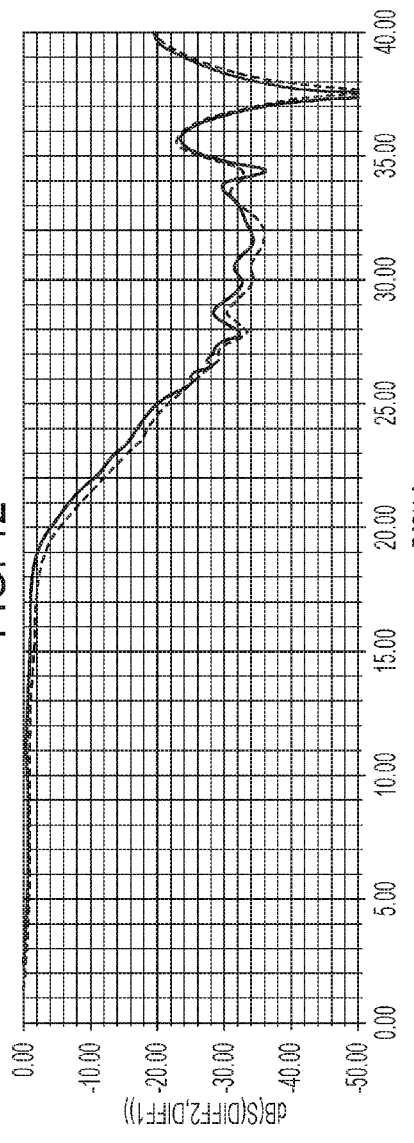
FIG. 13 is a graphical depiction of insertion loss performance of the modified motherboard of FIG. 12.
Figure 14:
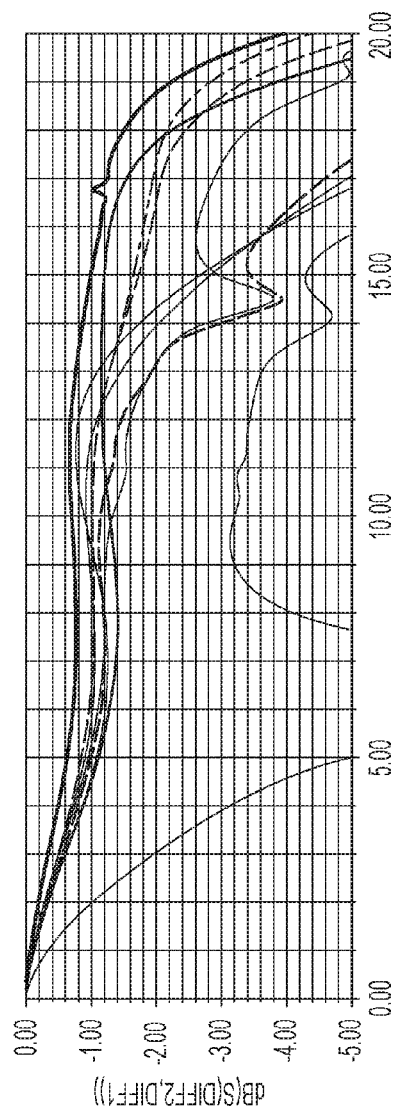
FIG. 14 is a graphical depiction of insertion loss performance of a fully modified motherboard.

The thinning of the intermediate pads 2 can result in a reduction of the intermediate pad 2 width from about 28 mils to about 21 mils (i.e., a 25% reduction in width). This leads to a noticeable reduction in parasitic capacitances since the outermost and central pads 2 (i.e., the ground/power pads) are effectively farther from the signal. Indeed, given the relatively large length of the intermediate pads 2, an increased inter-pad distance reduces capacitances substantially with minimal loop inductance increases. This improvement is evident starting even at low frequencies from 1 GHz and above, as shown in FIG. 13, and in the uppermost line of FIG. 14, which illustrates insertion loss detail from 0 to −5 dB between 0 and 20 GHz with all the modifications described above.

Figure 15:
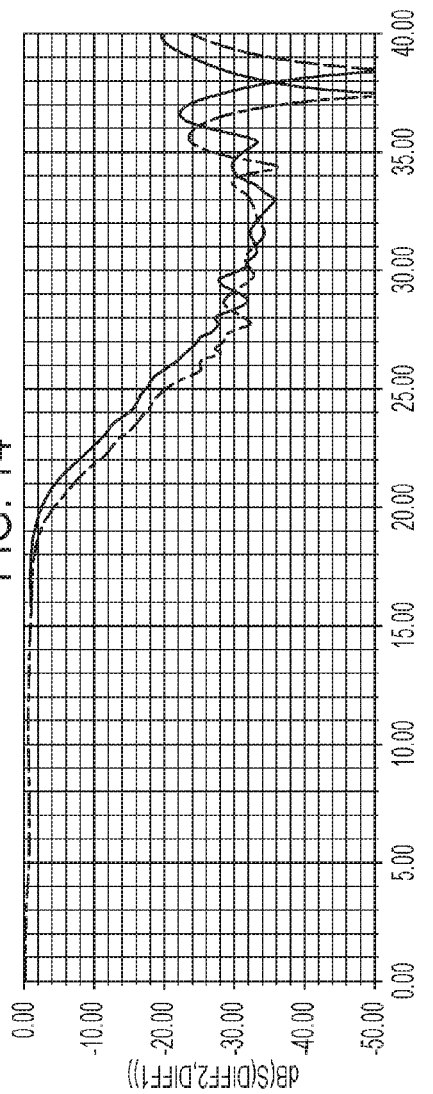
FIG. 15 is a graphical depiction of insertion loss performance of a fully modified motherboard of a dual in-line memory module (DIMM) connector system including mid-loss dielectric constant material.

With additional reference to FIG. 15, another modification of the motherboard in accordance with embodiments involves a change in materials from the standard FR4 material, which has a relatively high dielectric constant, to a mid-loss material FR406, which has a relatively low dielectric constant. As shown in FIG. 15, this material change leads to an average improvement of about 3 dB between 19 GHz and 25 GHz approximately corresponding to a $3^{rd}$ harmonic region for a 16 Gb/s signal.

Figure 16:
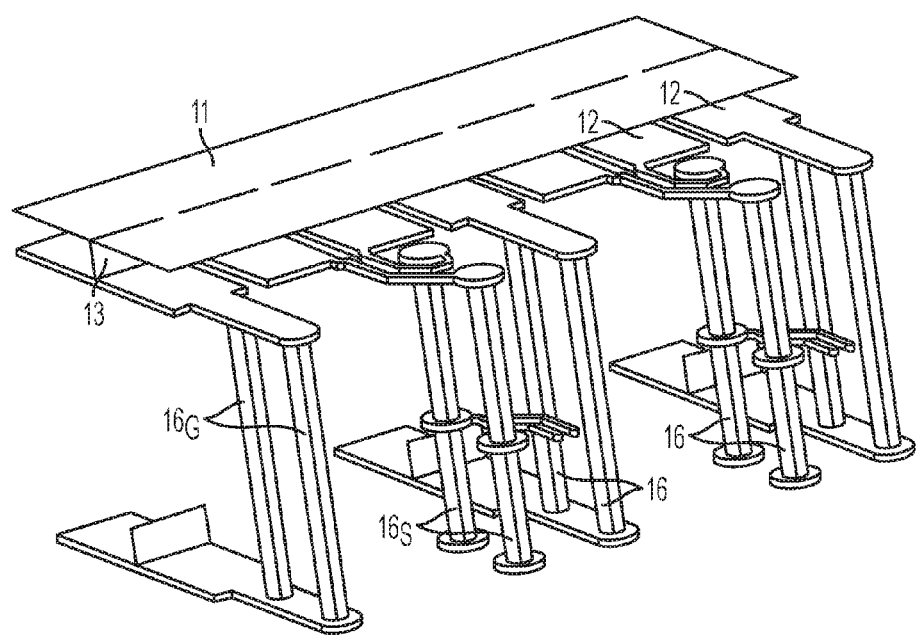
FIG. 16 is perspective view of an unmodified motherboard of a dual in-line memory module (DIMM) card.

With reference to FIG. 16, an unmodified DIMM includes a connector reference plane 11, a plurality of pads 12 and a corresponding plurality of simulated PCB-pad transitions 13 by which the pads 12 are electrically coupled to the connector reference plane 11. The connector reference plane 11 may be provided as an elongate member having a major width axis and a minor length axis that define a plane. The simulated PCB-pad transitions 13 are modeled to extend away from a surface of the connector reference plane 11. Each of the pads 12 may be provided as an elongate element that has a major length axis and a minor width axis that respectively define a pad plane. The pads 12 may be coplanar with one another such that each of the pads 12 extends along the same pad plane.

Whether the pads 12 are coplanar or not, the pads 12 are arranged at a different plane from the plane and respectively include first portions, which are electrically coupled to the connector reference plane 11 and are covered by the connector reference plane 11, and second portions that extend beyond an edge of the connector reference plane 11. The pads 12 may include outermost (or ground) pads 12 that are proximate to outer edges of the connector reference plane 11, a central (or ground) pad 12 that is proximate to a center of the connector reference plane 11 and intermediate (or signal) pads 12, which are interposed between the outermost pads 12 and the central pad 12. Distal ends of the intermediate pads 12 terminate short of the distal ends of the outermost and central pads 12. The outermost and central pads 12 may be provided for ground signal and power transmission and the intermediate pads 12 may be provided for source signal transmission.

The unmodified DIMM card may include sub-laminate layers and antipads as well as signal vias 16. A portion of the signal vias 16 extend from the distal ends of each of the outermost and central pads 12 and will hereinafter be referred to as ground/power vias $16_G$. Another portion of the signal vias 16 extend from the distal ends of each of the intermediate pads 12 and will hereinafter be referred to as signal vias $16_S$. The ground/power vias $16_G$ and the signal vias $16_S$ terminate at terminal pads disposed along a same plane.

Figure 17:
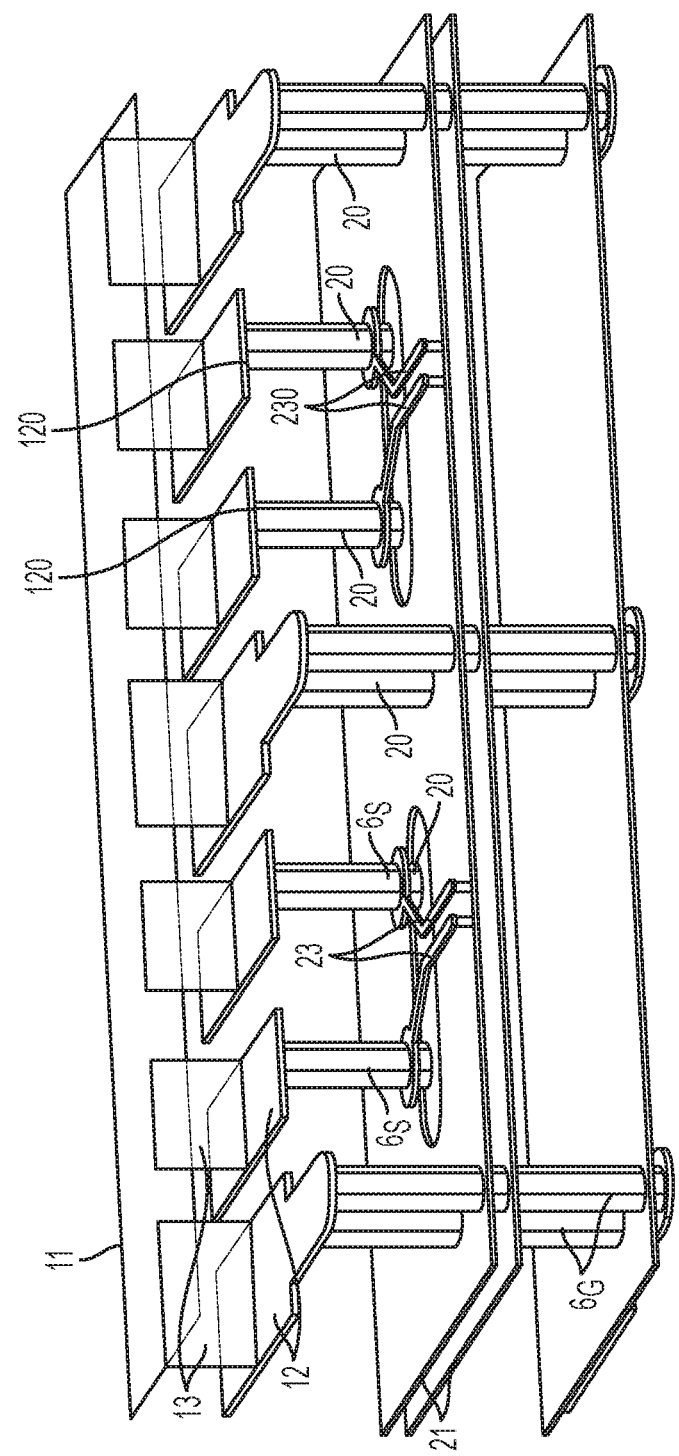
FIG. 17 is a perspective view of a modified motherboard of a dual in-line memory module (DIMM) card.
Figure 18:
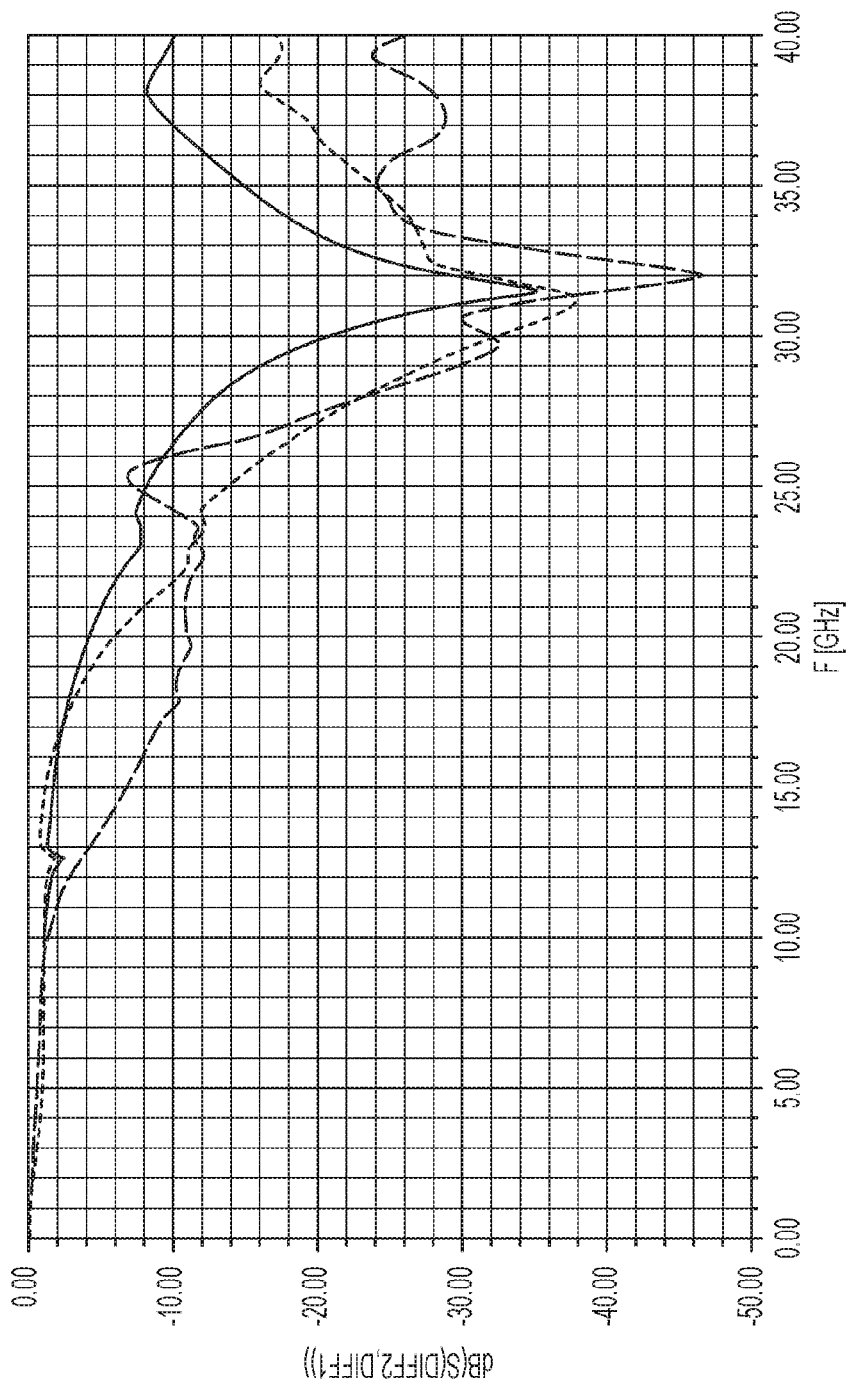
FIG. 18 is a graphical depiction of insertion loss performance of a fully modified DIMM card motherboard.

With continued reference to FIG. 16 and with additional reference to FIGS. 17 and 18, modifications of the DIMM card in accordance with embodiments are based on the recognition that the unmodified DIMM card includes differential via pairs 20 that are each rotated 90 degrees with respect to the pads 12 to allow for escape region routing. With this unmodified configuration, goals of the modifications are to reduce parasitic inductances and capacitances of signal paths caused by, for example, discontinuities due to the large changes in widths between the pads 12 and their corresponding traces and by the routing of those traces that is caused by serpentine configurations and sharp corners to thereby guarantee a minimal skew between signals of the differential pairs 20.

That is, as shown in FIG. 17, signal vias $16_S$ are located at the distal ends of the intermediate pads 12, which may include substantially flat edges 120, to provide for 90 degree rotations of the differential pairs 20. In addition, the widths of the intermediate pads 12 may be reduced by about 25% and sub-laminate layers 21 may be provided with common shared antipads 22 to reduce total capacitances. The signal vias $16_S$ will then terminate in blind via pairs at each of the shared antipads 22 with SMTs 23 extending directly outwardly toward a proximal edge of the uppermost sub-laminate layer 21. The antipads 22 may be rectangular or elliptical. The SMTs 23 may extend from the signal vias $16_S$ with one single angular portion 230 and a straight portion that runs toward a proximal edge of the uppermost sub-laminate layer 21.

The modified DIMM cards will thus have a ground structure that is shorted at its interconnections to thereby reduce loop inductances and to provide for solid shielding. In this way, stub lengths of the signal vias $16_S$ can be drastically reduced along with the crosstalk between the two sides of the card since any coupling between the two sides will be limited to what propagates vertically along the power distribution structure. As shown in FIG. 18, the improvement in insertion loss performance of the modified DIMM card is seen in the spectral region between 18 GHz and 40 GHz. Moreover, a mid-loss material with a dielectric constant similar to the one chosen for the motherboard could be used to minimize mismatch with the connector structure.

With reference to FIG. 19, a system 30 is provided and includes a DIMM card 31 modified as described above, a connector 32 and a motherboard 33 modified as described above. As shown in FIG. 19, the modified DIMM card 31 is coupled to the modified motherboard 33 by way of the SMTs 51' and the SMTs 230 at the connector 32 such that the system 30 as a whole exhibits the insertion loss and crosstalk shielding advantages noted above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A dual in-line memory module (DIMM) connector system, comprising:
- a motherboard comprising a printed circuit board (PCB) formed of mid-loss dielectric constant material FR4061, signal pads that are thinner than ground pads with the ground pads being disposed adjacent to the signal pads, signal vias connected to distal edges of the signal pads and shared antipads;
- a DIMM card comprising a printed circuit board (PCB) formed of mid-loss dielectric constant material FR4061, signal pads that are thinner than ground pads, signal vias connected to distal edges of the signal pads and shared antipads for respective pairs of the signal vias; and
- a connector by which the DIMM card is coupled with the motherboard,
- wherein widths of the signal pads are about 25% of the widths of the ground pads, the shared antipads are rectangular and distal ends of the signal pads comprise flat edges and a single convex curved edge interposed between and terminating at the flat edges, and
- wherein the DIMM connector system further comprises surface mounts (SMTs) extending from the signal vias with each having a respective single angular portion.

* * * * *